United States Patent
Anumula et al.

(10) Patent No.: US 6,545,524 B1
(45) Date of Patent: Apr. 8, 2003

(54) CONFIGURABLE MULTIPLEXING CIRCUIT AND METHOD

(75) Inventors: Sudhaker Reddy Anumula, San Diego, CA (US); Wei Fu, San Diego, CA (US); Joseph J. Balardeta, Carlsbad, CA (US); Paul Vanderbilt, Encinitas, CA (US); Allen C. Merrill, Encinitas, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/085,613

(22) Filed: Feb. 26, 2002

(51) Int. Cl.[7] .................... H03K 17/62; H03K 17/693; H03K 17/735
(52) U.S. Cl. ........................ 327/407; 327/415
(58) Field of Search ................ 327/407, 415, 327/295, 296; 375/376; 331/15

(56) References Cited

U.S. PATENT DOCUMENTS

| | | | | |
|---|---|---|---|---|
| 3,098,214 A | * | 7/1963 | Windes et al. ............ | 370/537 |
| 4,626,803 A | * | 12/1986 | Holm ........................ | 332/151 |
| 6,114,896 A | * | 9/2000 | Jung ......................... | 327/407 |
| 6,121,817 A | * | 9/2000 | Yang et al. ................ | 327/355 |

\* cited by examiner

*Primary Examiner*—Tuan T. Lam
(74) *Attorney, Agent, or Firm*—Gray Cary Ware & Freidenrich; Terrance A. Meador

(57) ABSTRACT

A configurable multiplexing circuit and arrangement suited for phase locked loop applications. The multiplexing circuit includes an EX-OR element, a multiplexer element and a summer element. Each element is configured for receiving a particular type of detection signal output, as an input for one of multiple selectable multiplexing operations. The multiplexing circuit further includes a selection signal input, coupled to the EX-OR element, the multiplexer element and the summer element, for receiving a selection signal that enables one or more of the EX-OR element, the multiplexer element, and the summer element. Non-enabled elements are powered down to eliminate jitter and performance penalties.

20 Claims, 2 Drawing Sheets

CONFIGURABLE MULTIPLEXING CIRCUIT AND METHOD

BACKGROUND OF THE INVENTION

This invention relates to signal processing, and more particularly to a multiplexing circuit for phase locked loop applications.

Phase locked loops are used for a variety of communication applications. Some phase locked loop circuits employ a multiplexer for configuring the loop to different modes of operation. Conventional multiplexing arrangements have limited options in configuring the loop for different applications. On the other hand, using multiple loops can cause power penalty, and may consume too much area in a semiconductor chip. Further, there may be performance degradation associated with using more than one loop, if not properly implemented.

These and other problems with conventional multiplexing arrangements therefore create a need for a high-performance, low-jitter configurable multiplexing circuit.

DETAILED DESCRIPTION OF THE PREFERRED EMBODIMENTS

Figure 1:
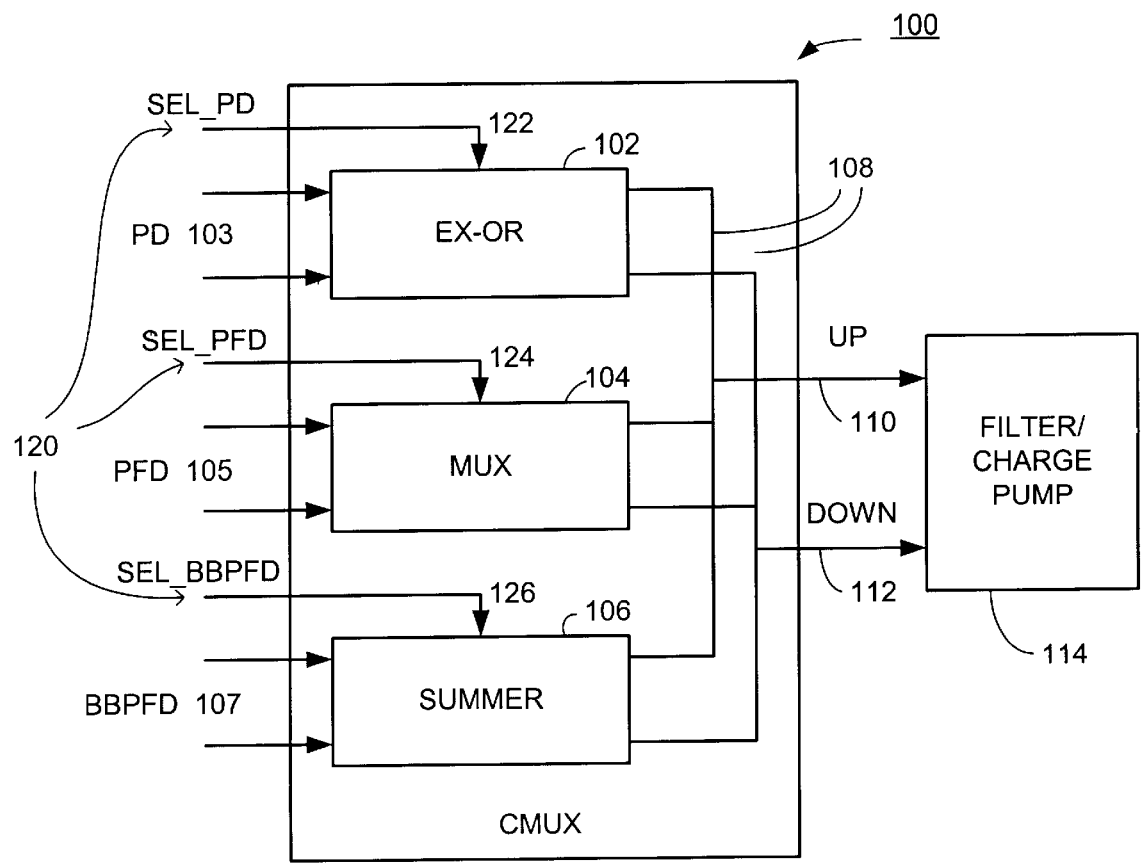
FIG. 1 is a configurable multiplexing circuit according to one embodiment.

This invention provides a configurable multiplexer (CMUX). The CMUX is particularly well-suited for phase locked loop applications, offering a number of multiplexing options for one or more of a number of input signal types. For example, the present invention may be employed in a multi-loop PLL circuit of the type described in U.S. Pat. application titled, "Configurable Triple Phase-Locked Loop Circuit and Method, " assigned to Applied Micro Circuits Corp., San Diego Calif. and the assignees of this invention, the contents of which are incorporated by reference for all purposes.

In one embodiment, this invention provides a phase locked loop the capability to operate with multiple input types, i.e. a reference clock application using a phase frequency detector, a no-reference clock application using a bang-bang phase frequency detector with nonreturn-to-zero (NRZ) data, and a clock recovery or synthesis application using a phase detector. Accordingly, various implementations are possible, for many other configurable applications.

The invention, embodied in hardware, firmware, or even software, includes a CMUX having an EX-OR element, a multiplexer element, a summer element, and a selection signal input. The selection signal input is preferably coupled to the EX-OR element, the multiplexer element, and the summer element. The selection signal input receives a selection signal that enables one or more of the EX-OR element, the multiplexer element, and the summer element. The selection signal may also disable any nonselected element, to eliminate or minimize jitter feedthrough, cross-signal noise, or other performance penalties.

In another embodiment of the invention, a CMUX includes a common output, an EX-OR configured to accept a first input signal, a multiplexer configured to accept a second input signal, and a summer configured to accept a third input signal. The CMUX further includes a selector configured to receive a selection signal for independent enabling of at least one, or a combination, of the EX-OR, the multiplexer, and the summer. The enabled EX-OR, multiplexer, and/or summer will execute its operation on the accepted input signal and provide an output signal to the common output. The non-enabled EX-OR, multiplexer, and/or summer is powered down, or disabled.

The invention may be embodied in hardware as a circuit or combination of circuits. In one such embodiment, a CMUX includes a plurality of inputs and a common output. The CMUX further includes an EX-OR circuit having an input to accept a first input signal, and configured to provide a first output to the common output. A multiplexer circuit has an input to accept a second input signal, and is configured to provide a second output to the common output. Furthermore, the CMUX includes a summer circuit having an input to accept a third input signal, and configured to provide a third output to the common output. According to a preferred embodiment, the EX-OR circuit, the multiplexer circuit, and the summer circuit are independently enabled.

FIG. 1 illustrates a CMUX 100 according to one embodiment of the invention. The CMUX 100 includes an EX-OR element 102, a multiplexer element 104, and a summer element 106. The CMUX further includes a common output 108 having an UP output line 110 and a DOWN output line 112. The EX-OR element 102 includes an input 103 configured to receive, when the EX-OR element 102 is enabled, HIGH and LOW signals corresponding to an output from a first detector type. The multiplexer element 104 includes an input 105 configured to receive, when the multiplexer element 104 is enabled, HIGH and LOW signals corresponding to an output from a second detector type. The summer element 106 includes an input 107 configured to receive, when the summer element 106 is enabled, HIGH and LOW signals corresponding to an output from a third detector type.

In a preferred embodiment, the first detector type is a phase detector, such as a Hogge phase detector used in a clock recovery loop. Further according to the embodiment, the second detector type is a phase frequency detector used in a clock synthesis loop. Still further according to the embodiment, the third detector type is a bang-bang (i.e. binary) phase frequency detector used in a no-reference clock application for clock recovery.

Each of the EX-OR element 102, multiplexer element 104, and summer element 106 can be implemented as simple well-known circuits including solid state logic gates, or may be implemented in silicon within the same or within different chips. The elements 102, 104 and 106 may still further be implemented in firmware, as an application specific integrated circuit (ASIC). Those having relevant skill in the pertinent art would recognize various possible implementations of these elements.

The CMUX 100 further includes a selection signal input 120 for receiving a selection signal. The selection signal is configured to enable one or more of the EX-OR element 102, the multiplexer element 104, and/or summer element 106, for receiving signals according to one or more multiplexing modes. In a preferred exemplary embodiment, the first detector type can be a phase detector, the second detector type can be a phase frequency detector, and the third detector type can be a bang-bang phase frequency detector. According to this embodiment, the selection signal input 120 can include a SEL_PD input 122 connected to the EX-OR element 102 for enabling the EX-OR element to receive signals from the phase detector in a first multiplexing mode. The selection signal input 120 can further include a SEL_PFD input 124 connected to enable the multiplexer element 104 to receive signals from the phase frequency detector in a second multiplexing mode. Furthermore, the selection signal input 120 can include a SEL_BBPFD input 126 connected to enable the summer element 106 to receive signals from the bang-bang phase frequency detector. The signal received on each of these inputs can be of any type, and have any format.

Each of the enabled EX-OR element 102, multiplexer element 104 and/or summer element outputs a result of its operation to the common output 108. The UP and DOWN signal lines 110, 112 may be connected to drive a filter/charge pump 114 in phase locked loop systems, for example. The CMUX 100 is accordingly well-suited for the phase locked loops that can be configured for multiple applications.

Figure 2:
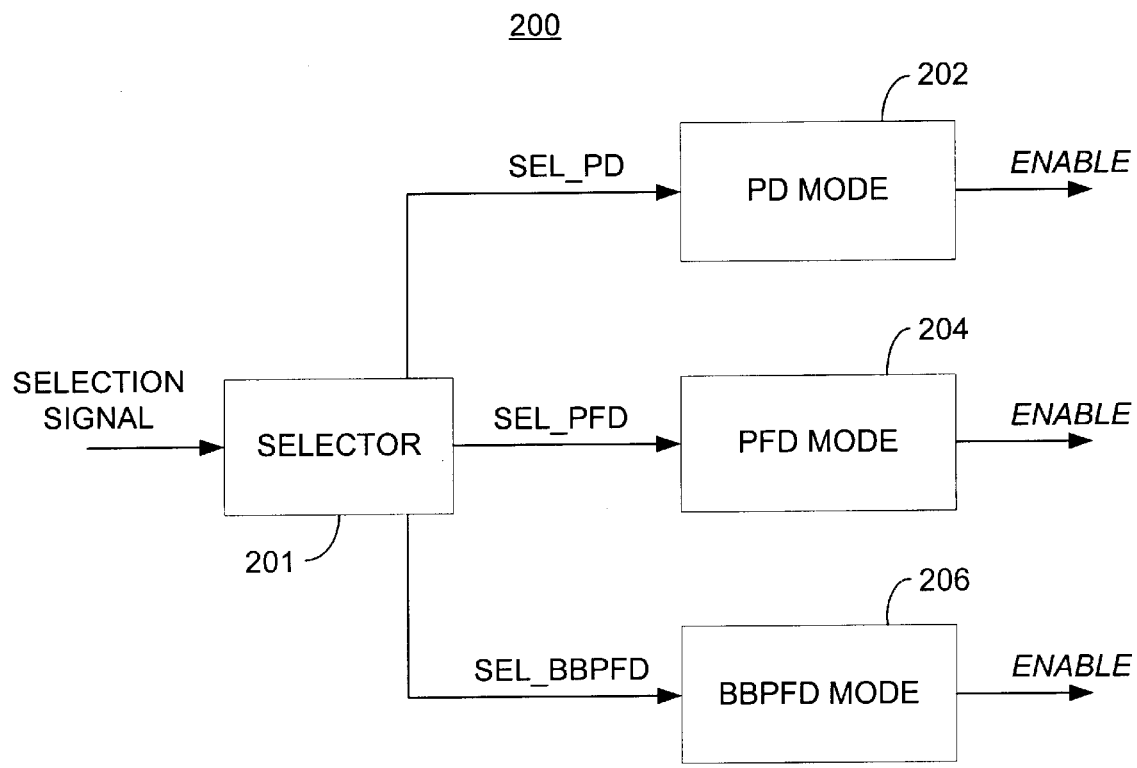
FIG. 2 shows a functional diagram for a configuration method according to the invention.

FIG. 2 is a functional diagram of the various configurations of the CMUX 100, to illustrate a method of the invention according to one embodiment. In this embodiment, the CMUX 100 can be configured to one, or more, of at least three multiplexing modes. A selector 201 is configured to receive a selection signal which specifies a multiplexing mode. In a first multiplexing mode, a PD mode 202, the CMUX circuit is configured to receive inputs from the phase detector when the SEL_PD signal is asserted. In a second multiplexing mode, a PFD mode 204, the CMUX circuit is configured to receive inputs from the phase frequency detector when the SEL_PFD signal is asserted. In a third multiplexing mode, BBPFD mode 206, the CMUX circuit is configured to receive inputs from the bang bang phase frequency detector when the SEL_BBPFD signal is asserted.

Each of the multiplexing modes corresponds to a particular phase locked loop application. The unselected, or non-enabled portions of the CMUX circuit can be powered down to eliminate jitter feed-through, or other adverse interference effects. FIG. 2 merely illustrates one level of possible configurations, incorporating multiple inputs and common outputs.

What is claimed is:

1. A configurable multiplexing arrangement, comprising:
    an EX-OR element;
    a multiplexer element;
    a summer element; and
    a selection signal input, coupled to the EX-OR element, the multiplexer element and the summer element, for receiving a selection signal that enables one or more of the EX-OR element, the multiplexer element, and the summer element.

2. The arrangement of claim 1, further comprising a common output, to which the enabled EX-OR element, multiplexer element, and/or summer element provides an output signal.

3. The arrangement of claim 1, wherein the selection signal input further includes a first select input to the EX-OR element, a second select input to the multiplexer element, and a third select input to the summer element.

4. The arrangement of claim 1, wherein the EX-OR element includes an input to accept a first input signal when the EX-OR element is enabled.

5. The arrangement of claim 4, wherein the first input signal includes a signal from a first detector type.

6. The arrangement of claim 5, wherein the first detector type is a phase detector.

7. The arrangement of claim 1, wherein the multiplexer element includes an input to accept a second input signal when the multiplexer element is enabled.

8. The arrangement of claim 7, wherein the second input signal includes a signal from a second detector type.

9. The arrangement of claim 8, wherein the second detector type is a phase frequency detector.

10. The arrangement of claim 1, wherein the summer element includes an input to accept a third input signal when the summer element is enabled.

11. The arrangement of claim 10, wherein the third input signal includes a signal from a third detector type.

12. The arrangement of claim 11, wherein the third detector type is a bang-bang phase frequency detector.

13. A configurable multiplexer, comprising:
    a common output;
    an EX-OR configured to accept a first input signal;
    a multiplexer configured to accept a second input signal;
    a summer configured to accept a third input signal; and
    a selector configured to receive a selection signal for independently enabling at least one of the EX-OR, multiplexer, and summer to provide an output signal to the common output.

14. A configurable multiplexing circuit having a plurality of inputs and a common output, comprising:
    an EX-OR circuit having an input to accept a first input signal, and being configured to provide a first output to the common output;
    a multiplexer circuit having an input to accept a second input signal, and being configured to provide a second output to the common output; and
    a summer circuit having an input to accept a third input signal, and being configured to provide a third output to the common output;
    wherein the EX-OR circuit, the multiplexer circuit, and the summer circuit are independently enabled.

15. The multiplexing circuit of claim 14, further comprising a selection input circuit having an output connected to each of the EX-OR circuit, the multiplexer circuit, and the summer circuit, for receiving a providing an input signal that enables each of the EX-OR circuit, the multiplexer circuit, and the summer circuit independently.

16. The multiplexing circuit of claim 15, wherein the selection input circuit includes a first output connected to the EX-OR circuit, a second output connected to the multiplexer circuit, and a third output connected to the summer circuit.

17. A method of configuring a multiplexing circuit, wherein the multiplexing circuit includes an EX-OR element, a multiplexer element, and a summer element, the method comprising:
    enabling at least one of the EX-OR element, the multiplexer element, and the summer element to receive one of a plurality of input signals; and
    disabling any of the EX-OR element, the multiplexer element, and the summer element that are not enabled.

18. In a multiplexing circuit having an EX-OR circuit, a multiplexer circuit, and a summer circuit, a method of performing a multiplexing operation, comprising:
    enabling, with a selection signal provided to the EX-OR circuit, the multiplexer circuit, and/or the summer circuit, at least one of the EX-OR circuit, the multiplexer circuit, and the summer circuit to receive one of a plurality of input signals; and
    disabling, with the selection signal, any of the EX-OR circuit, the multiplexer circuit, and the summer circuit that are not enabled.

19. The method of claim 18, wherein enabling at least one of the EX-OR circuit, the multiplexer circuit, and the summer circuit includes one of a plurality of multiplexing modes, including:

enabling the EX-OR circuit to receive input signals from a phase detector (PD) in a first multiplexing mode;

enabling the multiplexer circuit to receive input signals from a phase frequency detector (PFD) in a second multiplexing mode; and enabling the summer circuit to receive input signals from a bang-bang phase frequency detector (BBPFD) in a third multiplexing mode.

20. The method of claim 19, further comprising selecting one or more of the plurality of multiplexing modes simultaneously.

* * * * *